(12) United States Patent
Takemura

(10) Patent No.: US 12,315,744 B2
(45) Date of Patent: May 27, 2025

(54) PROCESSING APPARATUS

(71) Applicant: DISCO CORPORATION, Tokyo (JP)

(72) Inventor: Yuta Takemura, Tokyo (JP)

(73) Assignee: DISCO CORPORATION, Tokyo (JP)

(*) Notice: Subject to any disclaimer, the term of this patent is extended or adjusted under 35 U.S.C. 154(b) by 366 days.

(21) Appl. No.: 17/931,987

(22) Filed: Sep. 14, 2022

(65) Prior Publication Data

US 2023/0115824 A1 Apr. 13, 2023

(30) Foreign Application Priority Data

Sep. 24, 2021 (JP) ................................. 2021-155061

(51) Int. Cl.
*H01L 21/67* (2006.01)
*H01L 21/683* (2006.01)

(52) U.S. Cl.
CPC .. *H01L 21/67092* (2013.01); *H01L 21/67253* (2013.01); *H01L 21/6838* (2013.01)

(58) Field of Classification Search
CPC ......... B24B 49/12; B24B 49/02; B24B 49/04; B24B 49/045; B24B 49/10; B24B 37/005; B24B 37/04; B24B 37/042; B24B 37/10; B24B 37/27; B24B 37/30; B24B 37/34; B24B 9/065; B24B 9/06; B24B 9/08
See application file for complete search history.

(56) References Cited

U.S. PATENT DOCUMENTS

2009/0153868 A1* 6/2009 Sawabe .............. B23K 26/0665
356/445
2017/0294300 A1* 10/2017 Kozai ............... H01L 21/67259

FOREIGN PATENT DOCUMENTS

JP         2011249572 A      12/2011

OTHER PUBLICATIONS

JP 2011249572 A English Translation (Year: 2011) (Year: 2011).*

* cited by examiner

*Primary Examiner* — Monica S Carter
*Assistant Examiner* — Sharonda T Felton
(74) *Attorney, Agent, or Firm* — GREER BURNS & CRAIN, LTD.

(57) ABSTRACT

A processing apparatus includes a holding table having a holding surface that holds a workpiece and is smaller than the workpiece, a processing unit that processes the workpiece held by the holding table, an imaging unit that images the workpiece held by the holding table, and a controller. The holding table has a reflecting unit that surrounds the holding surface and is allowed to be positioned below an edge of the workpiece held by the holding surface, and at least part of the reflecting unit is formed of a reflective component and is imaged by the imaging unit in a state where the edge of the workpiece is positioned above the reflective component.

5 Claims, 10 Drawing Sheets

PROCESSING APPARATUS

BACKGROUND OF THE INVENTION

Field of the Invention

The present invention relates to a processing apparatus.

Description of the Related Art

There is the following method as a method using a processing apparatus that divides a workpiece into individual device chips. In a state where the workpiece is held on a holding table, an edge of the workpiece is imaged at multiple places by an imaging unit, and the edge is detected by image processing. Then, a center of the workpiece is calculated from the coordinates of multiple edges detected. For example, in Japanese Patent Laid-open No. 2011-249572, a technique in which an outer rim of a wafer is imaged and detected at three or more places and the center is detected is disclosed.

SUMMARY OF THE INVENTION

It is difficult for the processing apparatus of the related art to clearly image the edge of a workpiece in the state in which the workpiece is held by a holding table. In particular, in the case of removing an outer circumference of the workpiece by a cutting blade, in the processing apparatus, a holding surface is formed to be smaller than the workpiece to avoid contact between the cutting blade and the holding surface. In this case, in the processing apparatus of the related art, a component that supports a lower side of the edge of the workpiece does not exist, and therefore there is a possibility that an image obtained by imaging the edge of the workpiece blurs and the edge of the workpiece in the image is unclear.

Thus, an object of the present invention is to provide a processing apparatus that can clearly image an edge of a workpiece.

In accordance with an aspect of the present invention, there is provided processing apparatus including a holding table having a holding surface that holds a workpiece and is smaller than the workpiece, a processing unit that processes the workpiece held by the holding table, an imaging unit that images the workpiece held by the holding table, and a controller. The holding table has a reflecting unit that surrounds the holding surface and is allowed to be positioned below an edge of the workpiece held by the holding surface, and at least part of the reflecting unit is formed of a reflective component and is imaged by the imaging unit in a state in which the edge of the workpiece is positioned above the reflective component.

Preferably, the imaging unit images the edge of the workpiece positioned above the reflective component at a plurality of places, and the controller calculates coordinates of the edge from images obtained by the imaging and obtains the center position of the workpiece.

Preferably, the processing apparatus may remove an outer circumferential part of the workpiece by positioning a cutting blade of the processing unit to a position separate inward from the edge of the workpiece by a predetermined distance on the basis of the center position and relatively rotating the holding table and the cutting blade.

Preferably, the reflecting unit is positioned on the lower side relative to the holding surface.

Preferably, the workpiece is supported in an opening of an annular frame through a sheet, and the reflecting unit is a frame support unit that supports the annular frame.

The present invention provides an effect that the edge of the workpiece can be clearly imaged.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

An embodiment of the present invention will be described in detail below with reference to the drawings. The present invention is not limited by contents described in the following embodiment. Furthermore, what can be easily envisaged by those skilled in the art and what are substantially the same are included in constituent elements described below. Moreover, configurations described below can be combined as appropriate. In addition, various kinds of omission, replacement, or change of a configuration can be carried out without departing from the gist of the present invention.

In the embodiment to be described below, an XYZ orthogonal coordinate system is set, and the positional relation between the respective parts will be described with reference to this XYZ orthogonal coordinate system. One direction in the horizontal plane is defined as an X-axis direction. The direction orthogonal to the X-axis direction in the horizontal plane is defined as a Y-axis direction. The direction orthogonal to each of the X-axis direction and the Y-axis direction is defined as a Z-axis direction. The XY-plane including the X-axis and the Y-axis is parallel to the horizontal plane. The Z-axis direction orthogonal to the XY-plane is the vertical direction.

Figure 1:
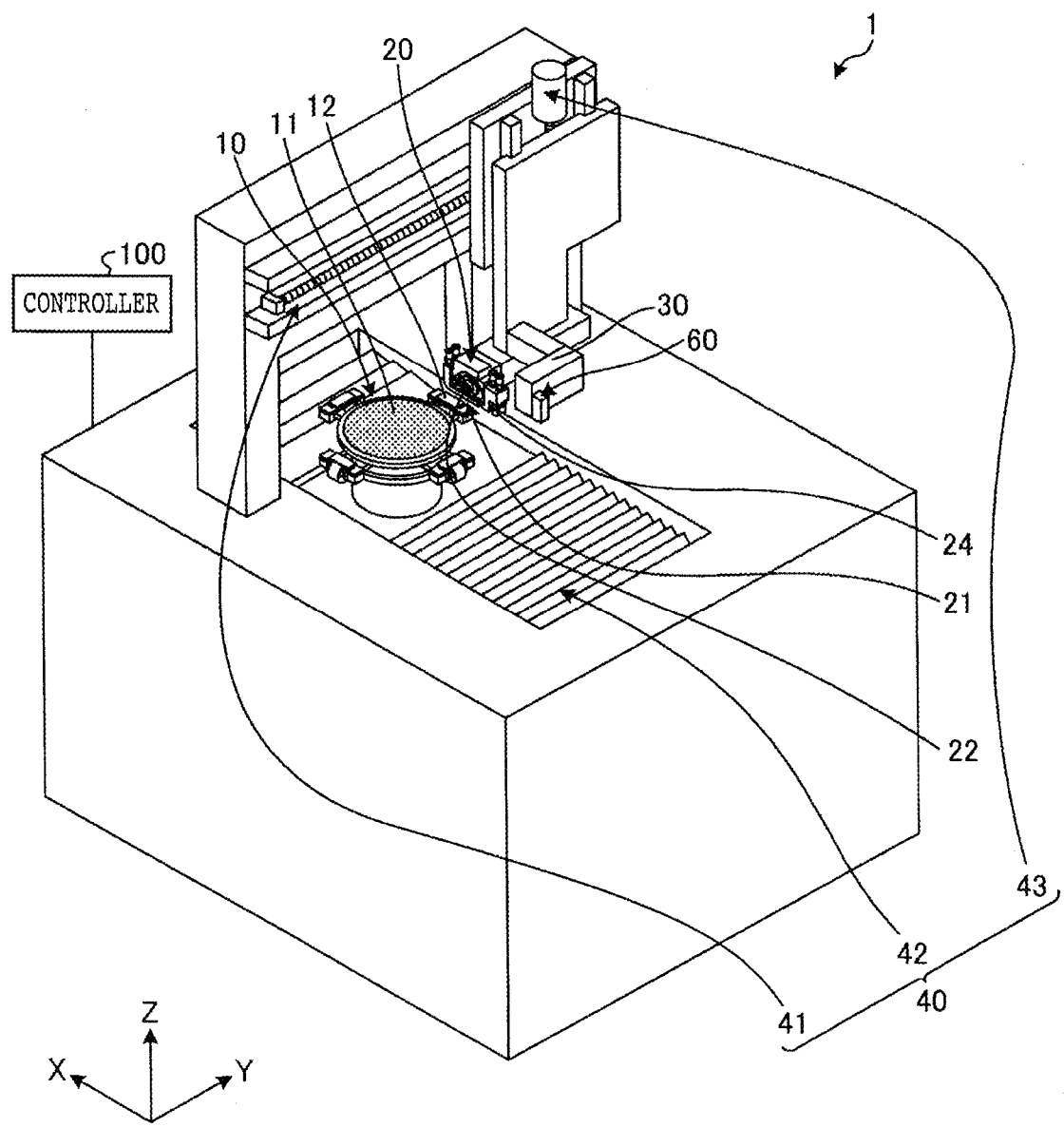
FIG. 1 is a perspective view illustrating a configuration example of a processing apparatus according to an embodiment of the present invention.
Figure 2:
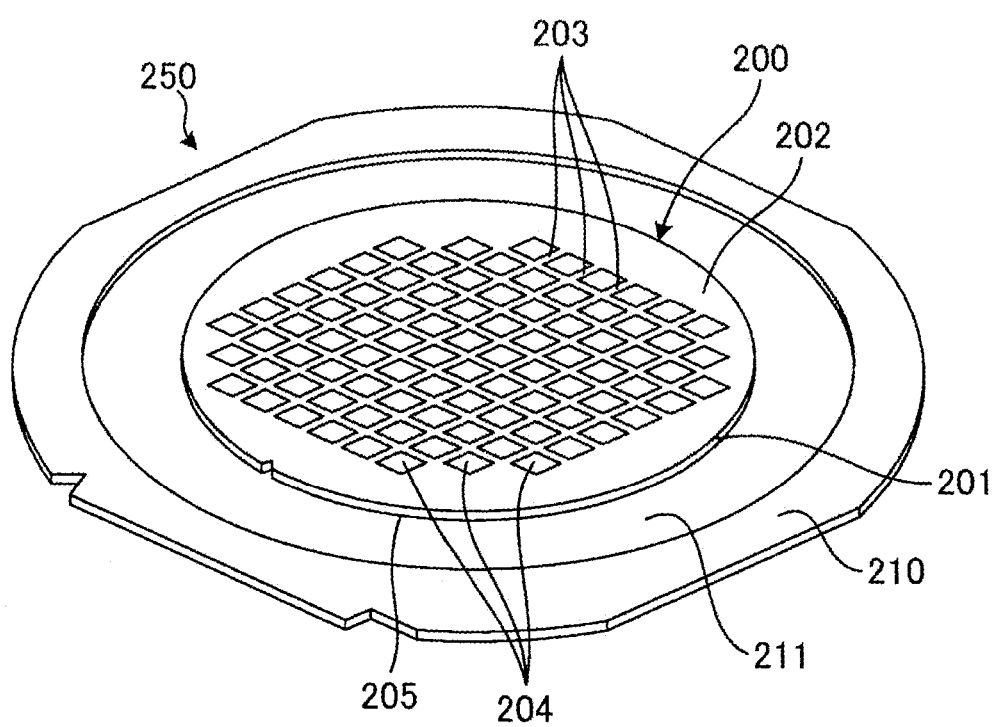
FIG. 2 is a perspective view illustrating a workpiece that is a processing target of the processing apparatus illustrated in FIG. 1.
Figure 3:
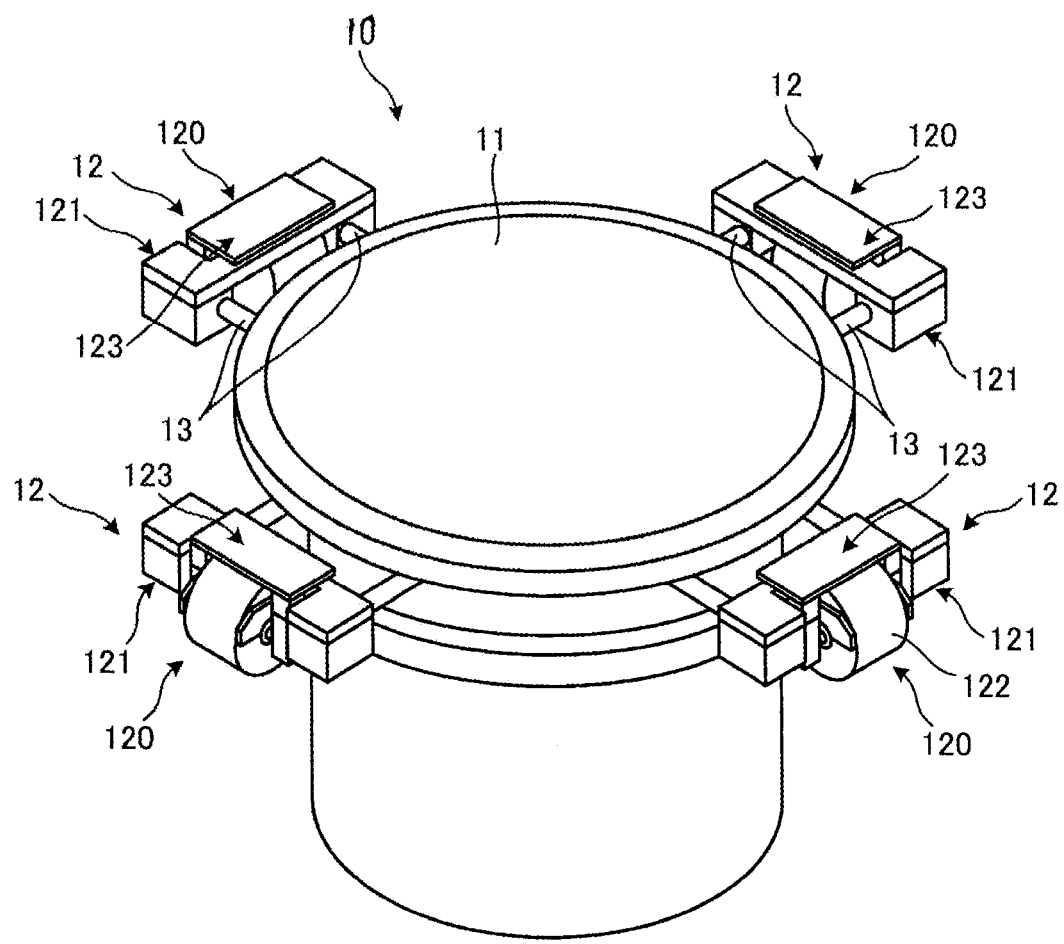
FIG. 3 is a perspective view illustrating one example of a holding table illustrated in FIG. 1.
Figure 4:
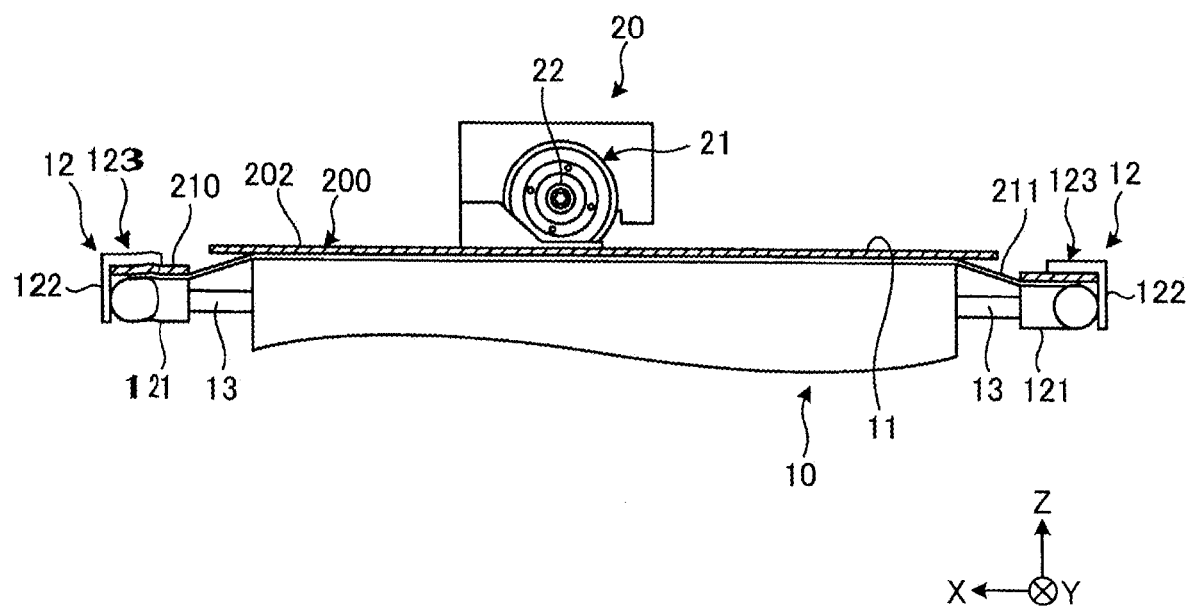
FIG. 4 is a schematic side view for explaining a relation between the holding table illustrated in FIG. 3, the workpiece, and a processing unit.
Figure 5:
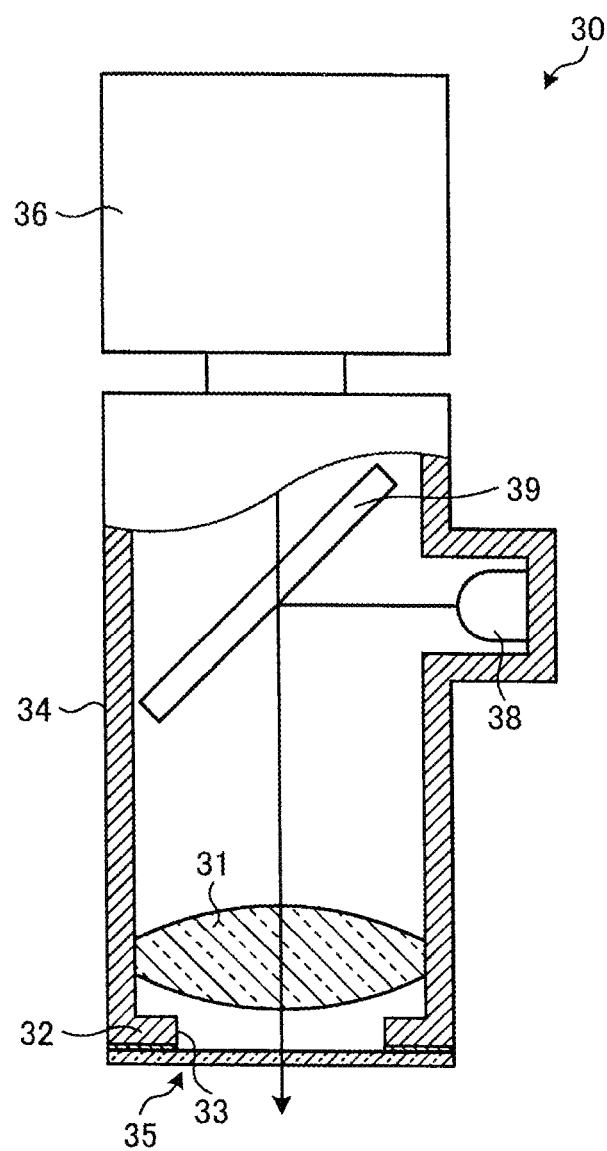
FIG. 5 is a schematic sectional view for explaining one example of an imaging unit illustrated in FIG. 1.

One example of a processing apparatus that processes a workpiece according to the embodiment will be described based on drawings. FIG. 1 is a perspective view illustrating a configuration example of the processing apparatus according to the embodiment. FIG. 2 is a perspective view illustrating the workpiece that is a processing target of the processing apparatus illustrated in FIG. 1. FIG. 3 is a perspective view illustrating one example of a holding table illustrated in FIG. 1. FIG. 4 is a schematic side view for explaining a relation between the holding table illustrated in FIG. 3, the workpiece, and a processing unit. FIG. 5 is a schematic sectional view for explaining one example of an imaging unit illustrated in FIG. 1.

A processing apparatus 1 illustrated in FIG. 1 according to the embodiment is cutting apparatus that executes cutting processing of a workpiece 200 that is a processing target object illustrated in FIG. 2 by a cutting blade 21 and divides the workpiece 200 into individual devices 204. In the embodiment, the workpiece 200 is a wafer such as a semiconductor wafer or optical device wafer that includes silicon, sapphire, gallium, or the like as a substrate 201 and has a circular plate shape. In the workpiece 200, the devices 204 are formed in regions marked out in a lattice manner by multiple planned dividing lines 203 formed in a lattice manner in an upper surface 202 of the substrate 201. The upper surface 202 of the substrate 201 is the surface of the substrate 201 of the workpiece 200 held by a holding table 10.

Furthermore, the workpiece 200 according to the embodiment may be a generally-called TAIKO (registered trademark) wafer in which a central part is thinned and a thick wall part is formed at an outer circumferential part. Besides the wafer, the workpiece 200 may be a rectangular package substrate having multiple devices sealed by a resin, a ceramic substrate in which the devices 204 and the planned dividing lines 203 are not set, a ferrite substrate, a glass plate, a substrate containing at least one of nickel and iron, or the like. In the embodiment, for the workpiece 200, a sheet 211 having an outer circumferential rim on which an annular frame 210 is mounted is stuck to a back surface 205, and the workpiece 200 is supported by the annular frame 210. The sheet 211 includes an adhesive tape, an adhesive sheet, and so forth, for example. A work unit 250 is what supports the workpiece 200 in an opening of the annular frame 210 through the sheet 211. [0018](Processing Apparatus) As illustrated in FIG. 1, the processing apparatus 1 according to the embodiment includes the holding table 10, a processing unit 20, an imaging unit 30, a movement unit 40, and a controller 100. The holding table 10 holds under suction the workpiece 200 by a holding surface 11. The processing unit 20 executes cutting processing of the workpiece 200 held by the holding table 10 by the cutting blade 21 mounted on a spindle 22. The imaging unit 30 images the workpiece 200 held by the holding table 10. The movement unit 40 relatively moves the holding table 10 and the processing unit 20. The controller 100 controls the respective constituent elements of the processing apparatus 1.

The movement unit 40 includes at least an X-axis movement unit 42 that executes processing feed of the holding table 10 in the X-axis direction parallel to the horizontal direction, a Y-axis movement unit 41 that executes indexing feed of the processing unit 20 and the imaging unit 30 in the Y-axis direction that is parallel to the horizontal direction and is orthogonal to the X-axis direction, and a Z-axis movement unit 43 that executes cutting-in feed of the processing unit 20 and the imaging unit 30 in the Z-axis direction.

The X-axis movement unit 42 executes processing feed of the holding table 10 and the processing unit 20 relatively along the X-axis direction by moving the holding table 10 in the X-axis direction. The Y-axis movement unit 41 executes indexing feed of the holding table 10 and the processing unit 20 relatively along the Y-axis direction by moving the processing unit 20 in the Y-axis direction, which is the indexing feed direction. The Z-axis movement unit 43 executes cutting-in feed of the holding table 10 and the processing unit 20 relatively along the Z-axis direction by moving the processing unit 20 in the Z-axis direction, which is the cutting-in feed direction.

In the holding table 10, the holding surface 11 that holds the workpiece 200 is formed of a porous ceramic or the like and has a circular disc shape. The holding table 10 is disposed to be capable of moving in the X-axis direction by the X-axis movement unit 42 and rotating around the axial center parallel to the Z-axis direction by a rotational drive source that is not illustrated in the diagram. In the holding table 10, the holding surface 11 is connected to a vacuum suction source that is not illustrated in the diagram. In the holding table 10, the workpiece 200 integrated with the annular frame 210 is placed over the holding surface 11 with the interposition of the sheet 211 and the holding surface 11 is sucked by the vacuum suction source. Thereby, the holding surface 11 holds under suction the workpiece 200 integrated with the annular frame 210.

As illustrated in FIG. 3 and FIG. 4, the holding table 10 has reflecting units 12 that surround the holding surface 11 and can be positioned below the edge of the workpiece 200 held by the holding surface 11. In the present embodiment, the reflecting units 12 are support units that support the workpiece 200 held by the holding surface 11. The multiple reflecting units 12 get contact with the workpiece 200 that protrudes from the holding surface 11 to the external and directly support the workpiece 200 from the lower side in the vertical direction. Alternatively, the multiple reflecting units 12 may be only positioned below the edge of the workpiece 200 without directly getting contact with the workpiece 200. In the one example illustrated in FIG. 3, the case in which the holding table 10 has four reflecting units 12 is described. However, a configuration in which the holding table 10 has one or two or more reflecting units 12 can be employed. For example, when the number of reflecting units 12 is one, the reflecting unit 12 may be an annular component that surrounds the holding surface 11. When the number of reflecting units 12 is two or more, the reflecting units 12 may be multiple components disposed along the outer rim of the holding surface 11.

In the present invention, the reflecting unit 12 has a frame support part 120 that supports the annular frame 210 of the workpiece 200 that protrudes from the holding surface 11 of the holding table 10 to the external. The frame support part 120 has a placement part 121 on which the annular frame 210 is placed and a pressing component 122 that turns around a rotation axis in the horizontal direction relative to the placement part 121. The frame support part 120 has a configuration in which the pressing component 122 turns and presses the annular frame 210 against the placement part 121 to support the annular frame 210. The frame support part 120 has such a configuration as to be allowed to be positioned below the edge of the workpiece 200 held on the holding surface 11 of the holding table 10. The frame support part 120 is disposed on guide rails 13 that extend in the horizontal direction from a lower part of the holding surface 11 of the holding table 10 movably in the radial direction of the holding surface 11 of the holding table 10 (horizontal direction). The frame support part 120 may be automatically moved by drive means that is not illustrated in the diagram or may be moved by an operator.

At least part of the reflecting unit 12 is formed of a reflective component. The reflective component includes, for example, a metal component of steel use stainless (SUS) or the like, paint disposed on the surface of the reflecting unit 12 as a reflective layer, and so forth. The reflecting unit 12 is imaged by the imaging unit in a state where the edge of the workpiece 200 is positioned above the reflective component. In the present embodiment, the reflecting units 12 have a reflective part 123 in which at least an upper surface is formed of the reflective component. For example, the reflective parts 123 include a placement surface of the placement part 121, the surface of the pressing component 122 in the state of overlapping with the placement part 121, and so forth. The reflective parts 123 include a surface that can be visually seen from the upper side of the processing apparatus 1 in the vertical direction, a surface imaged together with the workpiece 200, or the like in a state where the pressing component 122 is pressed against (overlaps with) the placement part 121. Due to movement of the frame support parts 120 on the guide rails 13, the reflective parts 123 of the reflecting units 12 are allowed to be positioned to overlap with the edge (outer circumference) of the workpiece 200 when being visually seen from the upper side even when the size of the annular frame 210 is changed.

In the case of full-cutting trimming to bevel the outer circumferential part of the workpiece 200, the annular frame 210 is not used in many cases. However, the processing apparatus 1 includes the frame support parts 120 that can move so as to be capable of responding for use in either the case in which the annular frame 210 is used or the case in which it is not used.

As illustrated in FIG. 4, the processing unit 20 is a unit on which the cutting blade 21 that cuts the workpiece 200 held by the holding table 10 is rotatably mounted. The processing unit 20 allows the cutting blade 21 to be positioned to any position on the holding surface 11 of the holding table 10 by the Y-axis movement unit 41 and the Z-axis movement unit 43. The processing unit 20 includes the cutting blade 21 and the spindle 22. The cutting blade 21 is fixed to the tip of the spindle 22 and rotates around the axial center parallel to the Y-axis direction in association with rotational operation of the spindle 22. The spindle 22 is supported by a spindle housing rotatably around the axial center parallel to the Y-axis direction and is housed in the spindle housing in a state where the tip thereof is exposed from the spindle housing to the external.

As illustrated in FIG. 1, the imaging unit 30 is fixed to the processing unit 20 so as to move integrally with the processing unit 20. In the embodiment, the imaging unit 30 is disposed at a position juxtaposed with the processing unit 20 in the X-axis direction. As illustrated in FIG. 5, the imaging unit 30 includes a casing 34 that houses an objective lens 31 opposed to the workpiece 200 held by the holding table 10 and has an opening 33 formed in a bottom part 32 that faces the workpiece 200, a protective plate 35 that is formed of a transparent body that covers the opening 33 and has a flat plate shape, and an imaging device 36.

The casing 34 houses the objective lens 31 in a lower end part. In the embodiment, the casing 34 is formed into a rectangular cylindrical shape and is attached to the processing unit 20. The opening 33 penetrates the bottom part 32 of the casing 34 and, in the embodiment, is formed into a circular shape and is made at the center of the bottom part 32. The planar shape of the protective plate 35 is formed into a rectangle that is the same shape as the bottom part 32 of the casing 34. The protective plate 35 is fixed to the lower surface of the bottom part 32 of the casing 34. In the embodiment, the protective plate 35 is fixed to the lower surface of the bottom part 32 by an adhesive and seals the opening 33 to suppress infiltration of cutting dust and mist composed of cutting water and so forth from the opening 33 into the casing 34.

The imaging device 36 is what is attached to an upper end part of the casing 34 and photographs a region to be divided in the workpiece 200 before cutting held by the holding table 10 through the objective lens 31, the opening 33, and the protective plate 35. The imaging device 36 includes a charge-coupled device (CCD) imaging element or a complementary metal-oxide-semiconductor (CMOS) imaging element, for example. The imaging device 36 photographs the workpiece 200 held by the holding table 10 and obtains an image for performing alignment to execute position adjustment between the workpiece 200 and the cutting blade 21, and so forth, to output the obtained image to the controller 100.

Furthermore, the casing 34 houses a light source 38 that emits light for illuminating the workpiece 200 held by the holding table 10 through the objective lens 31, the opening 33, and the protective plate 35 and a half mirror 39 that reflects the light emitted by the light source 38 toward the objective lens 31 and permits the imaging unit 30 to image the workpiece 200 over the holding table 10 through the objective lens 31 and so forth. In the embodiment, the light source 38 is a light emitting element such as a light emitting diode (LED). However, in the present invention, the light source 38 may be an optical fiber that propagates light emitted by a light emitting element such as an LED.

Referring back to FIG. 1, the controller 100 is what controls each of the above-described constituent elements of the processing apparatus 1 and causes the processing apparatus 1 to execute processing operation for the workpiece 200. The controller 100 is a computer. The controller 100 has a calculation processing device having a microprocessor like a central processing unit (CPU), a storing device having a memory like a read only memory (ROM) or a random access memory (RAN), and an input-output interface device. The calculation processing device of the controller 100 executes calculation processing according to a computer program stored in the storing device and outputs a control signal for controlling the processing apparatus 1 to the above-described constituent elements of the processing apparatus 1 through the input-output interface device. The controller 100 controls processing, imaging, and so forth for the workpiece 200 by executing the program.

Furthermore, the controller 100 is connected to a display unit that is configured by a liquid crystal display device or the like that displays the state of processing operation, images, and so forth and is not illustrated in the diagram and an input unit that is used when an operator registers information on the contents of processing or the like and is not illustrated in the diagram. The input unit is configured by at least one of a touch panel disposed on the display unit and an external input device such as a keyboard.

The controller 100 can provide a function of controlling processing of the workpiece 200 held by the holding surface 11. For example, the controller 100 executes cutting processing of the workpiece 200 held by the holding table 10 along the planned dividing line by relatively moving the holding table 10 and the processing unit 20 along the planned dividing line by the X-axis movement unit 42, the Y-axis movement unit 41, and the Z-axis movement unit 43. When the frame support parts 120 are equipped with a drive source that is not illustrated in the diagram, the controller 100 executes control for positioning the reflective part 123 of the reflecting unit 12 below an edge 206 of the workpiece 200. Furthermore, the controller 100 can provide a function of positioning the imaging unit 30 to an imaging position by the X-axis movement unit 42, the Y-axis movement unit 41, and the Z-axis movement unit 43 and calculating the coordinates of the edge of the workpiece 200 from images obtained by imaging by the imaging unit 30 to obtain the center of the workpiece 200. For example, the controller 100 can detect the center of the workpiece 200 by using the technique described in Japanese Patent Laid-open No. 2011-249572, or the like. The controller 100 executes control to cause the imaging unit 30 to image the edge 206 of the workpiece 200 in a state where the edge 206 is positioned above the reflective part 123 of the reflecting unit 12.

The configuration example of the processing apparatus 1 according to the present embodiment has been described above. The above-described configuration explained with use of FIG. 1 to FIG. 5 is merely one example and the configuration of the processing apparatus 1 according to the present embodiment is not limited to this example. The functional configuration of the processing apparatus 1 according to the present embodiment can be flexibly deformed according to specifications and operation.

(Imaging Method of Processing Apparatus)

Figure 6:
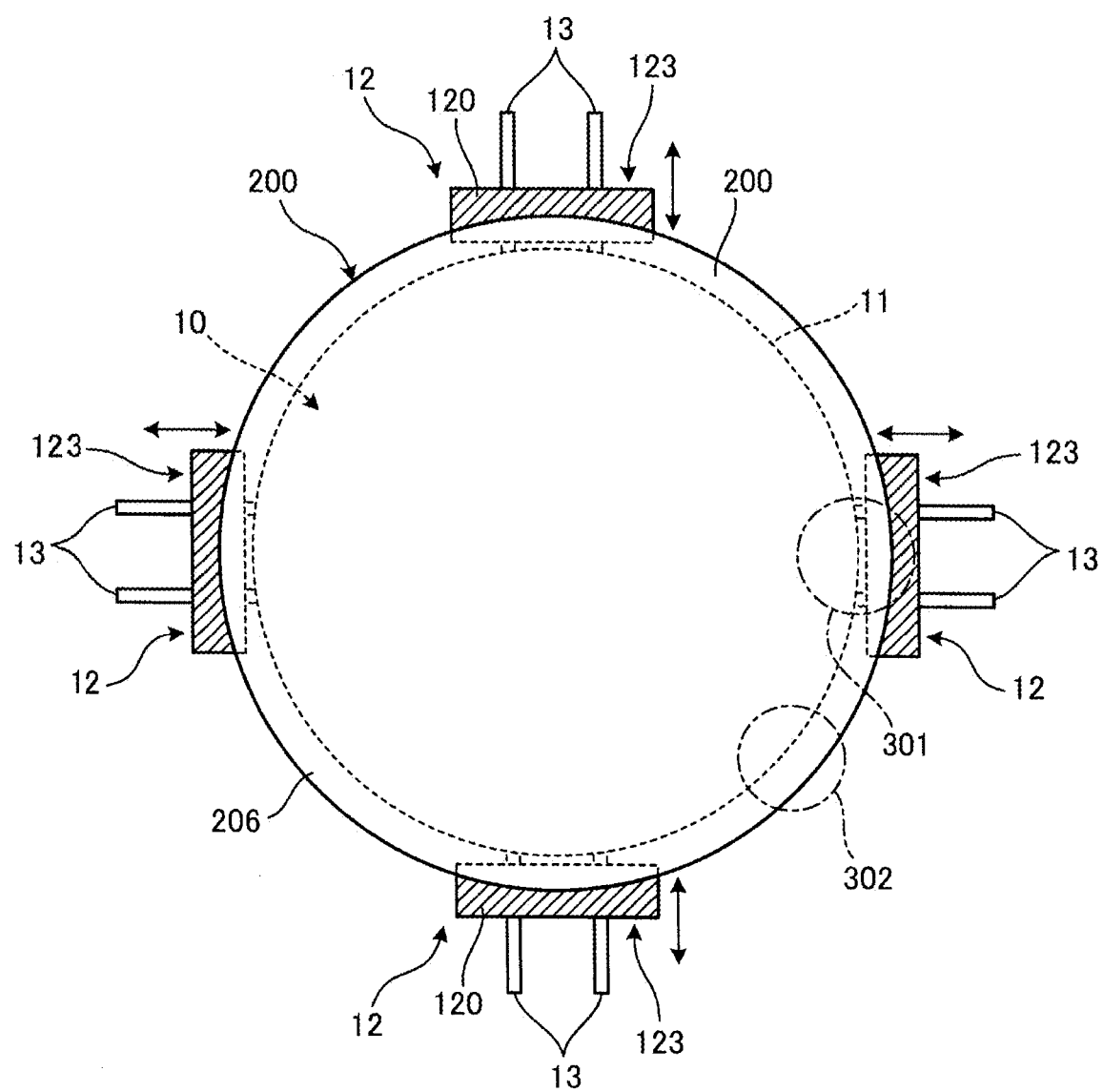
FIG. 6 is a schematic top view illustrating one example of an arrangement relation between the holding table and the workpiece.
Figure 7:
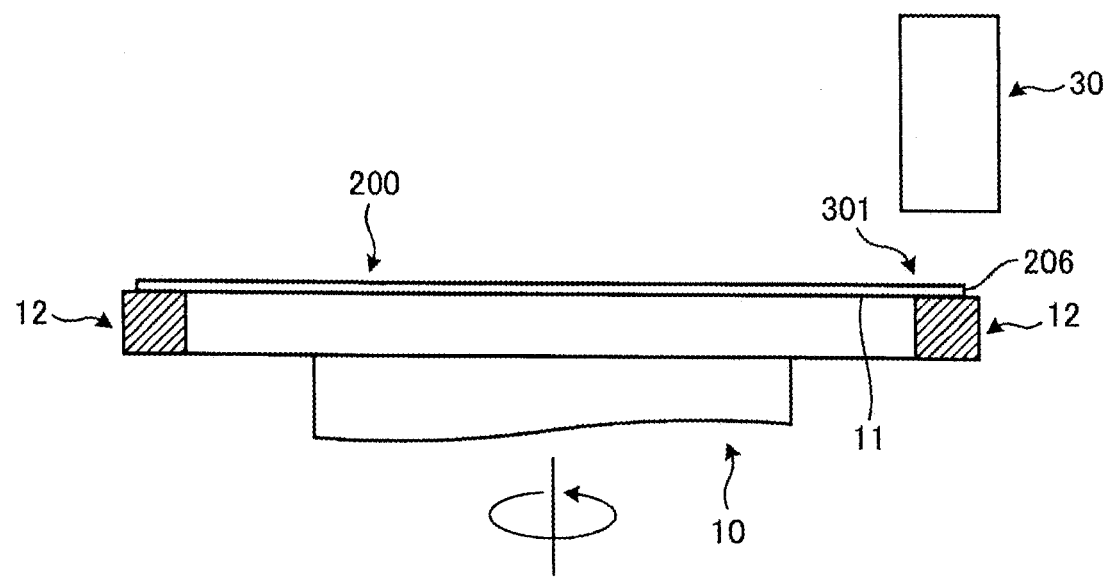
FIG. 7 is a schematic diagram illustrating one example of an arrangement relation between a reflecting unit of the holding table and the imaging unit.
Figure 8:
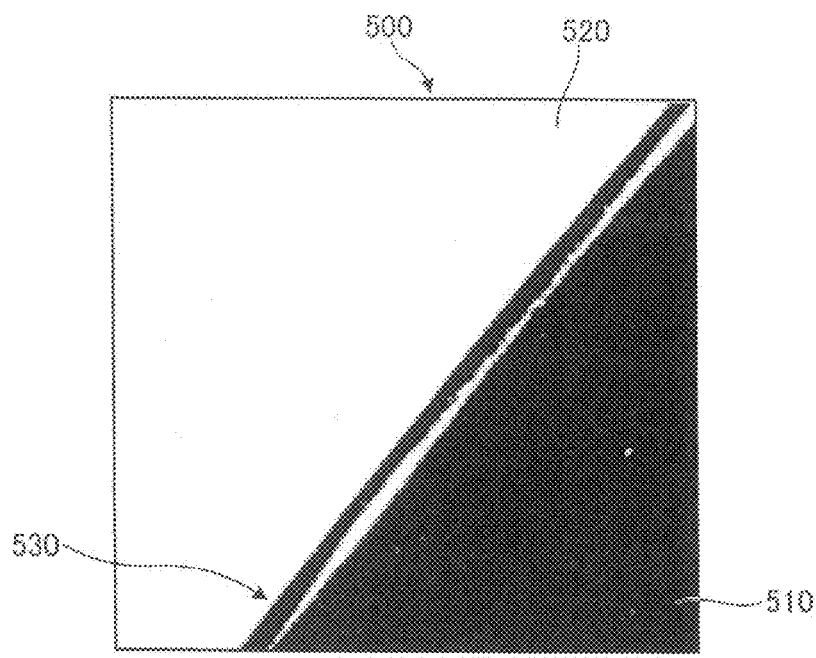
FIG. 8 is a diagram illustrating one example of an image obtained by imaging an edge of the workpiece by the processing apparatus with use of a reflective part of the reflecting unit.
Figure 9:
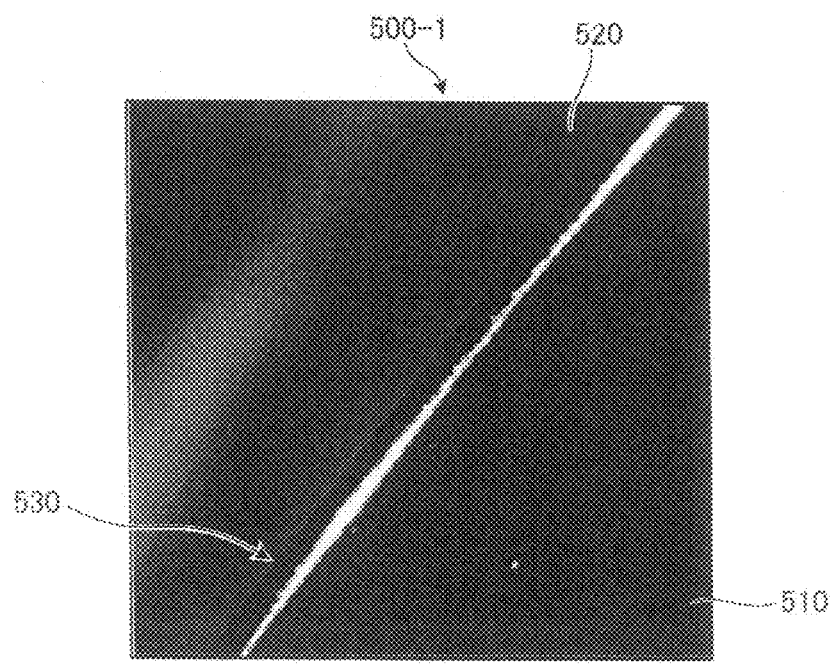
FIG. 9 is a diagram illustrating one example of an image obtained by imaging the edge of the workpiece by the processing apparatus without using the reflective part of the reflecting unit.

Next, an imaging method executed by the processing apparatus 1 according to the embodiment will be described. FIG. 6 is a schematic top view illustrating one example of an arrangement relation between the holding table 10 and the workpiece 200. FIG. 7 is a schematic diagram illustrating one example of an arrangement relation between the reflecting unit 12 of the holding table 10 and the imaging unit 30. FIG. 8 is a diagram illustrating one example of an image obtained by imaging the edge 206 of the workpiece 200 by the processing apparatus 1 with use of the reflective part 123 of the reflecting unit 12. FIG. 9 is a diagram illustrating one example of an image obtained by imaging the edge 206 of the workpiece 200 by the processing apparatus 1 without using the reflective part 123 of the reflecting unit 12.

In the one example illustrated in FIG. 6, the processing apparatus 1 holds the workpiece 200 with a diameter larger than that of the holding surface 11 of the holding table 10 by the holding table 10 in a state where the edge 206 protrudes to the external of the holding surface 11. The edge 206 of the workpiece 200 includes the rim of the workpiece 200, the outer circumferential including a range of a surface within a certain distance from the rim, and so forth. Each of the multiple reflecting units 12 is disposed in such a manner that the reflective part 123 is located below the edge 206 of the workpiece 200. The reflecting units 12 have such a configuration as to be allowed to be located below the edge 206 of the workpieces 200 with multiple sizes different from each other through movement in the radial direction of the holding surface 11 along the guide rails 13. The processing apparatus 1 positions the edge 206 of the workpiece 200 above the reflective parts 123 of the reflecting units 12 by moving the reflecting units 12 along the guide rails 13 by drive means that is not illustrated in the diagram.

As illustrated in FIG. 7, the processing apparatus 1 controls the X-axis movement unit 42, the Y-axis movement unit 41, and the Z-axis movement unit 43 to cause the imaging unit 30 to be positioned to an imaging position at which imaging can be executed in such a manner that the reflective part 123 of the reflecting unit 12 overlaps with the edge 206 of the workpiece 200. The imaging position includes the position, a rotation angle, a height, and so forth of the holding table 10 set with respect to the workpiece 200 in advance, for example. The processing apparatus 1 images a part of an imaging region 301 (see FIG. 6 and FIG. 7) including the edge 206 of the workpiece 200 and the reflecting unit 12 by the imaging unit 30 positioned to the imaging position.

In this case, when light associated with the imaging is incident on the surface of the workpiece 200 from the imaging unit 30 (upper side) and is reflected, the light is captured by the objective lens 31 of the imaging unit 30. However, when the light associated with the imaging is obliquely incident on the surface of the workpiece 200 and is reflected, the light is not captured by the objective lens 31 of the imaging unit 30 and the workpiece 200 is imaged as black and the outside of the workpiece 200 is imaged as white. The light associated with the imaging includes light emitted by the light source 38 of the imaging unit 30, light from the surroundings of the processing apparatus 1, and so forth, for example. Furthermore, when the light associated with the imaging is diffusely reflected by the reflective part 123 of the reflecting unit 12, part of the light diffusely reflected is captured by the objective lens 31 of the imaging unit 30. The vicinity of the edge 206 in the surface of the workpiece 200 is beveled in order to prevent breakage and roundness or an inclination is formed at the time of generation of the workpiece 200. Therefore, the light associated with the imaging is diffusely reflected and it is difficult for the light to be captured by the imaging unit 30. Due to this, in an image 500 obtained by imaging the imaging region 301 by the imaging unit 30, as illustrated in FIG. 8, a first region 510 arising from imaging the workpiece 200 becomes a dark region and a second region 520 arising from imaging the reflective part 123 of the reflecting unit 12 becomes a brighter region than the first region 510. As a result, in the image 500, the contrast across a boundary 530 between the first region 510 and the second region 520 becomes distinct and therefore it becomes possible to recognize the boundary 530 as the edge 206 (outer circumference) of the workpiece 200.

In contrast, suppose that the processing apparatus 1 images an imaging region 302 (see FIG. 6) including the edge 206 of the workpiece 200 and the external thereof at a position at which the reflecting unit 12 does not exist below the workpiece 200, i.e. a position at which the lower side of the outside of the workpiece 200 is a bellows-shaped part that covers the X-axis movement unit 42. In this case, when the light associated with the imaging travels toward the external of the workpiece 200, because the reflective part 123 of the reflecting unit 12 does not exist, the light travels toward the bellows-shaped part of the X-axis movement unit 42 located below the holding table 10 and is not captured by the objective lens 31 of the imaging unit 30. Furthermore, when the surface of the bellows-shaped part of the X-axis movement unit 42 is a black component, the light associated with the imaging is not reflected by the surface of the bellows-shaped part of the X-axis movement unit 42. Due to this, as illustrated in FIG. 9, in an image 500-1 obtained by imaging by the imaging unit 30, both the first region 510 arising from imaging the workpiece 200 and a third region 540 arising from imaging the external of the workpiece 200 below which the reflective part 123 of the reflecting unit 12 does not exist become a dark region. Thus, the image 500-1 becomes an image in which the contrast across the boundary 530 between the first region 510 and the third region 540 is indistinct and the external of the edge 206 of the workpiece 200 blurs and is unclear.

By analyzing the image 500 obtained by imaging the edge 206 of the workpiece 200 and the reflective part 123 of the reflecting unit 12, the processing apparatus 1 according to the embodiment can improve the accuracy of calculation of the coordinates of the edge 206 of the workpiece 200 on the basis of the clear boundary 530 between the edge 206 of the workpiece 200 and the reflective part 123. Furthermore, because utilizing the reflecting units 12 that the holding table 10 has, the processing apparatus 1 can image the edge 206 of the workpiece 200 without adding a new configuration.

The controller 100 of the processing apparatus 1 uses each of the four reflecting units 12 of the holding table 10 for four imaging regions 301 and images the four imaging regions 301 by the imaging unit 30. The controller 100 detects four sets of position coordinates on the edge 206 of the workpiece 200 from four images. For example, the controller 100 detects the center of the workpiece 200 by using the technique described in Japanese Patent Laid-open No. 2011-249572, or the like. The controller 100 calculates the position coordinates of three or more points different from each other on the edge 206 of the workpiece 200 by image processing. The multiple sets of position coordinates can be decided as appropriate based on the positions of the reflecting units 12 of the holding table 10, for example. The controller 100 detects the center of the workpiece 200 on the basis of the circumscribed circle of the triangle indicated by the multiple sets of position coordinates. When having detected the center of the workpiece 200, the controller 100 stores coordinate information indicating the coordinates of the center in the storing device.

After detecting the center of the workpiece 200, the controller 100 removes a part of the outer circumferential part of the workpiece 200 by positioning the cutting blade 21 to a position at a predetermined distance from the edge 206 of the workpiece 200 on the basis of the center position of the workpiece 200 and relatively rotating the holding table 10 and the cutting blade 21. Furthermore, the controller 100 can measure the upper surface height of the workpiece 200 on the basis of the detected center position of the workpiece 200 and cause the processing unit 20 to operate according to the upper surface height and process the workpiece 200 along the planned dividing lines 203. Thus, the processing apparatus 1 accurately obtains the center position of the workpiece 200 and executes processing for the workpiece 200 on the basis of the center position and therefore can improve the processing accuracy.

Due to the above, by bringing the edge 206 of the workpiece 200 close to the reflective part 123 of the reflecting unit 12 and executing imaging, the processing apparatus 1 can clearly image the boundary between the edge 206 and the reflective part 123 although the workpiece 200 is held in a state where the edge 206 of the workpiece 200 protrudes to the external from the holding surface 11 of the holding table 10. This allows the processing apparatus 1 to accurately grasp the edge 206 of the workpiece 200 and therefore improve the processing accuracy of the workpiece 200 held in a state where it protrudes from the holding table 10.

Although the workpiece 200 larger than the holding surface 11 of the holding table 10 is used as the work unit 250, the processing apparatus 1 can clearly image the edge 206 of the workpiece 200 by the reflecting unit 12 that supports the annular frame 210. This allows the processing apparatus 1 to obtain images arising from clearly imaging the edge 206 of the workpiece 200 by utilizing the reflecting units 12 having the frame support parts 120 that support the annular frame 210 without adding a new configuration.

Modification Example of Embodiment

Figure 10:
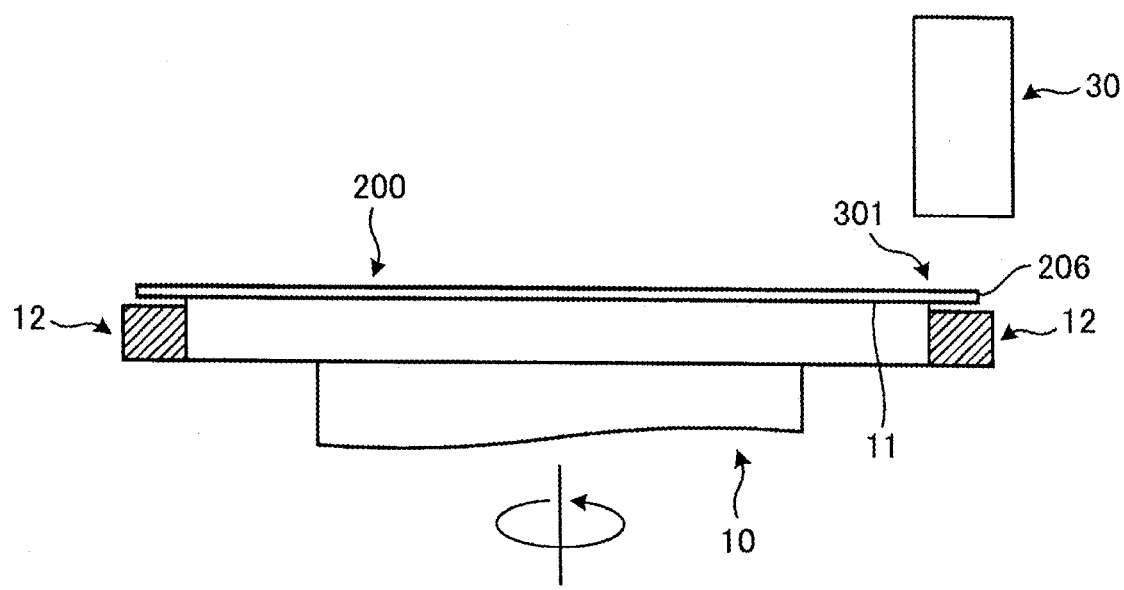
FIG. 10 is a sectional view for explaining a relation example between a holding surface and the reflecting units of the processing apparatus according to a modification example of the embodiment.

FIG. 10 is a diagram for explaining a relation example between the holding surface 11 and the reflecting units 12 of the processing apparatus 1 according to a modification example of the embodiment. In the case of executing full-cutting trimming of the workpiece 200, the processing apparatus 1 positions the cutting blade 21 beside the edge 206 of the workpiece 200 and executes the processing. In this case, it suffices that the processing apparatus 1 is configured in such a manner that, as illustrated in FIG. 10, the reflective parts 123 of the reflecting units 12 can be positioned to the lower side relative to the holding surface 11 of the holding table 10. It suffices that the processing apparatus 1 is configured in such a manner that the reflective part 123 does not get contact with the cutting blade 21 in the case of executing the full-cutting trimming of the workpiece 200. This allows the processing apparatus 1 to avoid contact with the cutting blade 21 by the reflecting unit 12 also at the time of the full-cutting trimming to remove the edge 206 of the cutting blade 21.

Figure 11:
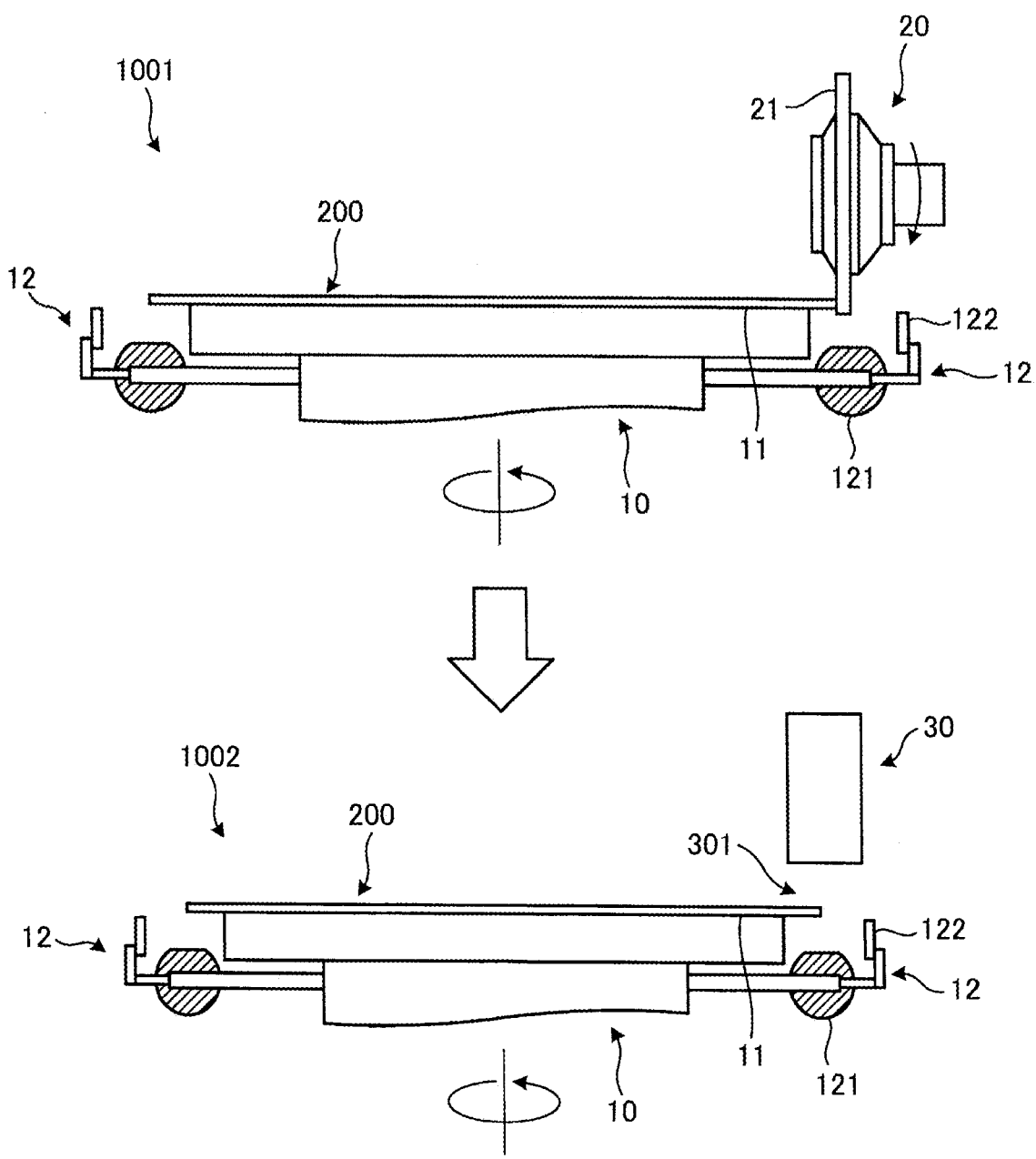
FIG. 11 is a sectional view for explaining another use example of the holding table of the processing apparatus according to the modification example of the embodiment.

In the above-described embodiment, the case in which the reflective parts 123 of the reflecting units 12 have the placement part 121 and the pressing component 122 in the processing apparatus 1 has been described. However, the configuration is not limited thereto. FIG. 11 is a diagram for explaining another use example of the holding table 10 of the processing apparatus 1 according to the modification example of the embodiment.

In a scene 1001 illustrated in FIG. 11, in the processing apparatus 1, the cutting blade 21 is cutting the edge 206 of the workpiece 200 in a state where the workpiece 200 is held by the holding surface 11 of the holding table 10 without using the above-described annular frame 210. In this case, in the processing apparatus 1, the annular frame 210 is not placed on the placement parts 121 and therefore the placement parts 121 and the pressing components 122 are in a non-contact state. The non-contact state is a state where the pressing components 122 are not pressed against the placement parts 121. The placement parts 121 and the pressing components 122 are formed of reflective components.

In a scene 1002, in the processing apparatus 1, the reflecting units 12 are set to the non-contact state and therefore the placement surfaces (upper surfaces) of the placement parts 121 function as the above-described reflective parts 123. The processing apparatus 1 controls the X-axis movement unit 42, the Y-axis movement unit 41, and the Z-axis movement unit 43 to cause the imaging unit 30 to be positioned to an imaging position at which imaging can be executed from the upper side in such a manner that the placement part 121 of the reflecting unit 12 overlaps with the edge 206 of the workpiece 200. The processing apparatus 1 images a part of the imaging region 301 including the edge 206 of the workpiece 200 and the reflecting unit 12 by the imaging unit 30 positioned to the imaging position.

Due to this, by positioning the edge 206 of the workpiece 200 above the placement part 121 of the reflecting unit 12 and executing imaging, the processing apparatus 1 can clearly image the boundary between the edge 206 and the reflecting unit 12 although the workpiece 200 is held in a state where it protrudes from the holding table 10. This allows the processing apparatus 1 to accurately recognize the edge 206 of the workpiece 200 and therefore improve the processing accuracy of the workpiece 200 held in the state in which it protrudes from the holding table 10.

The present invention is not limited to the above-described embodiment and so forth. That is, the present invention can be carried out with various modifications without departing from the gist of the present invention.

In the above-described embodiment, the case in which the reflective parts 123 are disposed in all of the four reflecting units 12 in the processing apparatus 1 has been described. However, the configuration is not limited thereto. The processing apparatus 1 may have a configuration in which the reflective part 123 is disposed in at least one reflecting unit 12 in the four reflecting units 12.

In the above-described embodiment, the case in which the reflecting units 12 are the frame support parts 120 that support the annular frame 210 in the processing apparatus 1 has been described. However, the configuration is not limited thereto. The reflecting unit 12 may be an annular component that surrounds the holding surface 11 of the holding table 10 or may be multiple components disposed along the outer circumference of the holding surface 11.

The processing apparatus 1 may employ one annular component instead of including the multiple reflecting units 12. For example, a ring-shaped reflective component that surrounds the holding surface 11 of the holding table 10 may be employed as the annular component and the annular component may be disposed in the processing apparatus 1 in such a manner as to be positioned on the lower side relative to the holding surface 11.

In the above-described embodiment, the case in which the workpiece 200 is larger than the holding surface 11 of the holding table 10 in the processing apparatus 1 has been described. However, the configuration is not limited thereto. For example, when the workpiece 200 has the same size as the holding surface 11, the processing apparatus 1 can obtain images in which the edge 206 of the workpiece 200 is clear similarly to the embodiment by positioning the reflective part 123 of the reflecting unit 12 to cause the workpiece 200 and the reflective part 123 to be adjacent to each other and executing imaging.

In the above-described embodiment, the case in which the processing apparatus 1 processes the workpiece 200 with a circular disc shape has been described. However, the configuration is not limited thereto. The processing apparatus 1 may use a workpiece with a rectangular shape, a polygonal shape, or the like, for example. In this case, it suffices that an imaging target place on the workpiece is positioned above the reflective part 123 of the reflecting unit 12.

In the above-described embodiment, the case in which the processing apparatus 1 is cutting apparatus has been described. However, the processing apparatus 1 may be apparatus other than the cutting apparatus, such as a grinding apparatus or a laser processing apparatus.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A processing apparatus comprising:
    a holding table having a holding surface that holds a workpiece and is smaller than the workpiece;
    a processing unit that is configured and arranged to process the workpiece held by the holding table;
    an imaging unit that is configured and arranged to image the workpiece held by the holding table; and
    a controller,
    wherein:
        the holding table has a reflecting unit that surrounds the holding surface and is allowed to be positioned below an edge of the workpiece held by the holding surface, and
        at least part of the reflecting unit is formed of a reflective component and further wherein the reflecting unit is configured and arranged to be imaged by the imaging unit in a state in which the edge of the workpiece is positioned above the reflective component.

2. The processing apparatus according to claim 1, wherein:
    the imaging unit is configured and arranged to image the edge of the workpiece positioned above the reflective component at a plurality of places, and
    the controller is configured and arranged to calculate coordinates of the edge from images obtained by the imaging and to obtain a center position of the workpiece.

3. The processing apparatus according to claim 2, wherein the processing apparatus is configured and arranged to remove an outer circumferential part of the workpiece by positioning a cutting blade of the processing unit to a position separate from the edge of the workpiece in an inward direction by a predetermined distance on a basis of the center position and by relatively rotating the holding table and the cutting blade.

4. The processing apparatus according to claim 3, wherein the reflecting unit is positioned on a lower side relative to the holding surface.

5. The processing apparatus according to claim 1, wherein:
    the workpiece is supported in an opening of an annular frame by a sheet, and
    the reflecting unit is configured and arranged to support the annular frame.

* * * * *